(12) United States Patent
Konno et al.

(10) Patent No.: US 7,183,211 B2
(45) Date of Patent: Feb. 27, 2007

(54) PROCESS FOR CHEMICAL MECHANICAL POLISHING OF SEMICONDUCTOR SUBSTRATE AND AQUEOUS DISPERSION FOR CHEMICAL MECHANICAL POLISHING

(75) Inventors: Tomohisa Konno, Tokyo (JP); Masayuki Motonari, Tokyo (JP); Masayuki Hattori, Tokyo (JP); Nobuo Kawahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 196 days.

(21) Appl. No.: 10/349,092

(22) Filed: Jan. 23, 2003

(65) Prior Publication Data
US 2003/0153183 A1    Aug. 14, 2003

(30) Foreign Application Priority Data
Jan. 25, 2002 (JP) ............................. 2002-016701
Oct. 7, 2002 (JP) ............................. 2002-293223

(51) Int. Cl.
*H01L 21/461* (2006.01)
*H01L 21/302* (2006.01)

(52) U.S. Cl. ....................... 438/691; 438/692; 438/693

(58) Field of Classification Search ......... 438/690–693
See application file for complete search history.

(56) References Cited

U.S. PATENT DOCUMENTS

| | | | |
|---|---|---|---|
| 6,426,294 B1 * | 7/2002 | Hirabayashi et al. | 438/690 |
| 6,447,563 B1 * | 9/2002 | Mahulikar | 51/309 |
| 6,585,786 B2 * | 7/2003 | Tsuchiya et al. | 51/307 |
| 6,596,638 B1 * | 7/2003 | Kondo et al. | 438/690 |

(Continued)

FOREIGN PATENT DOCUMENTS

EP    0 846 742    6/1998

(Continued)

OTHER PUBLICATIONS

U.S. Serial No. 10/279,843, filed Oct. 25, 2003, Konno et al.

(Continued)

*Primary Examiner*—Duy-Vu N. Deo
(74) *Attorney, Agent, or Firm*—Oblon, Spivak, McClelland, Maier & Neustadt, P.C.

(57) ABSTRACT

The object of the present invention is to provide a process for chemical mechanical polishing of semiconductor substrate that is particularly useful for chemical mechanical polishing a wafer having a wiring pattern and an insulating layer having a low dielectric constant is formed between wiring patterns, interlayers in the case of a multi-layer wiring and the like in the process of producing a semiconductor device, and an aqueous dispersion for chemical mechanical polishing which is used in this process. The process for chemical mechanical polishing of a semiconductor substrate of the present invention is that a surface to be polished of the semiconductor substrate is polished under conditions of a rotation speed of a polishing table fixing a polishing pad at the range from 50 to 200 rpm and a pressing pressure of the semiconductor substrate fixed to a polishing head against a polishing pad at the range from 700 to 18,000 Pa, by using an aqueous dispersion for chemical mechanical polishing comprising an abrasive and at least one compound selected from the group consisting of polycarboxylic acid having a heterocycle and anhydride thereof, and the polishing pad.

51 Claims, 1 Drawing Sheet

U.S. PATENT DOCUMENTS

| | | | |
|---|---|---|---|
| 6,620,215 B2 * | 9/2003 | Li et al. | 51/298 |
| 6,641,631 B2 * | 11/2003 | Thomas et al. | 51/309 |
| 6,749,488 B2 * | 6/2004 | Pasqualoni et al. | 451/41 |
| 6,774,041 B1 * | 8/2004 | Kondo et al. | 438/692 |
| 2003/0104770 A1 * | 6/2003 | Pasqualoni et al. | 451/60 |

FOREIGN PATENT DOCUMENTS

| | | |
|---|---|---|
| EP | 1 020 488 | 7/2000 |
| EP | 1 036 836 | 9/2000 |
| EP | 1 116 762 | 7/2001 |
| EP | 1 167 482 | 1/2002 |
| JP | 2000-204352 | 7/2000 |
| JP | 2001-110759 | 4/2001 |
| JP | 2001-110761 | 4/2001 |
| JP | 2001-127027 | 5/2001 |
| JP | 2001-152133 | 6/2001 |
| JP | 2001-152135 | 6/2001 |
| JP | 2001-269859 | 10/2001 |
| WO | WO 99/64527 | 12/1999 |
| WO | WO 00/13217 | 3/2000 |

OTHER PUBLICATIONS

U.S. Serial No. 10/349,092, filed Jan. 23, 2003, Konno et al.

* cited by examiner

US 7,183,211 B2

PROCESS FOR CHEMICAL MECHANICAL POLISHING OF SEMICONDUCTOR SUBSTRATE AND AQUEOUS DISPERSION FOR CHEMICAL MECHANICAL POLISHING

TITLE OF THE INVENTION

Process for chemical mechanical polishing of semiconductor substrate and aqueous dispersion for chemical mechanical polishing

BACKGROUND OF THE INVENTION

1. Field of the Invention

The present invention relates to a process for chemical mechanical polishing (which may hereinafter be referred to "CMP") of semiconductor substrates and an aqueous dispersion for chemical mechanical polishing. More specifically, the present invention relates to a process for chemical mechanical polishing that is particularly useful for chemical mechanical polishing a wafer having a wiring pattern and an insulating layer having a low dielectric constant is formed between wiring patterns, interlayers in the case of a multi-layer wiring and the like in the process of producing a semiconductor device, and an aqueous dispersion for chemical mechanical polishing which is used in this process.

2. Description of the Related Art

A $SiO_2$ layer formed by a vacuum process such as a CVD method is conventionally used as an insulating layer formed on a semiconductor element and the like. In recent years, more attention is being focused on achieving a lower dielectric constant of the insulating layer for the purpose of improving VLSI performance. Lower dielectric constants have been achieved by the development of insulating layer, in place of $SiO_2$ layer with a high dielectric constant, including, silsesquioxane (dielectric constant; approximately 2.6 to 3.0), fluorine-containing $SiO_2$ (dielectric constant; approximately 3.3 to 3.5), polyimide-based resins (dielectric constant; approximately 2.4 to 3.6, trade name; "PIQ" by Hitachi Chemical Industries Co., Ltd.; trade name; "FLARE" by Allied Signal Corp., and the like), benzocyclobutene (dielectric constant; approximately 2.7, trade name; "BCB" by Dow Chemical Corp., and the like.), hydrogen-containing SOG (dielectric constant; approximately 2.5 to 2.5) and organic SOG (dielectric constant; approximately 2.9, trade name; "HSGR7" by Hitachi Chemical Industries Co., Ltd.) and the like. Since these insulating layers have low mechanical strength and are soft and brittle as compared to $SiO_2$ layers, however, they sometimes produce a large number of scratches having large or small shapes with a conventional CMP method.

In addition, as shown in FIG. 1, in the case a surface of a semiconductor substrate having a wiring board formed by stacking an insulating layer 2 having a low dielectric constant on a substrate 1 comprised of silicon wafer and the like, forming a trench part 5, and depositing a metal 4 as a wiring material on the whole surface of the substrate with a trench on which a barrier metal layer 3 has been formed, is polished, the following undesirable phenomenon is observed in some cases. That is, the insulating layer having a low dielectric constant as a lower layer peels from its periphery during polishing at a step where the insulating layer having a low dielectric constant is not exposed on the polishing surface, that is, at a step where only a metal layer as a wiring material is chemically mechanical polished.

In order to solve the problem as described above, a variety of methods have been proposed.

For example, a technique has been described which can suppress surface defects of a surface to be polished when a metal layer is chemically mechanical polished using a silica particle as an abrasive, (for example, in JP-A-2001-110, 761). In addition, another technique has been described which can suppress surface defects of a surface to be polished by a slurry containing no solid abrasive (for example, in WO 00/13,217 pamphlet).

In these techniques, the insulating layer having a low dielectric constant as described above is not supposed as a material to be polished, however, suppression of occurrence of scratches, peeling at a periphery part and the like on the material to be polished during chemical mechanical polishing, are not studied.

On the other hand, an attempt has been made to reduce scratches generated during chemical mechanical polishing of an insulating layer having a low dielectric constant by lowering a pressing pressure of a polishing head of a chemical mechanical polishing apparatus. However, when a chemical mechanical polishing of the above-mentioned stacked material is performed by using the previously known chemical mechanical aqueous dispersion under the conditions of lowered pressing pressure of the polishing head, a sufficient removal rate is not obtained. This is particularly true at a step where the insulating layer having a low dielectric constant for which occurrence of scratches should be reduced is not exposed on the surface to be polished. That is, at a step where only a metal layer comprised of copper, tungsten, aluminum or the like as a wiring material is exposed thereon. As a result there is a problem of insufficient throughput with such a process.

SUMMARY OF THE INVENTION

The present invention solves the abovementioned problems and an object of the present invention is to provide a process for chemical mechanical polishing that is particularly useful for chemical mechanical polishing a wafer having a wiring pattern and an insulating layer having a low dielectric constant is formed between wiring patterns, interlayers in the case of a multi-layer wiring and the like in the process of producing a semiconductor device, and an aqueous dispersion for chemical mechanical polishing which is used in this process.

The present invention is based on the findings described above and can be described as follows.

[1]. A process for chemical mechanical polishing of a semiconductor substrate characterized in that a surface to be polished of the semiconductor substrate is polished under conditions of a rotation speed of a polishing table fixing a polishing pad at the range from 50 to 200 rpm and a pressing pressure of the semiconductor substrate fixed to a polishing head against the polishing pad at the range from 700 to 18,000 Pa, by using an aqueous dispersion for chemical mechanical polishing comprising (A) an abrasive and (B) at least one compound selected from the group consisting of polycarboxylic acid having a heterocycle and anhydride thereof, and the polishing pad.

[2]. The process for chemical mechanical polishing of a semiconductor substrate according to [1] above, wherein the abrasive (A) is comprised of at least one kind of particle selected from the group consisting of an inorganic particle and an organic particle, and an organic-inorganic composite particle.

[3]. The process for chemical mechanical polishing of a semiconductor substrate according to [2] above, wherein the polycarboxylic acid having a heterocycle and anhydride thereof (B) is at least one compound selected from the group consisting of 2,3-pyridinedicarboxylic acid, 2,3-pyridinedicarboxylic anhydride, 2,5-pyridinedicarboxylic acid, 2,6-pyridinedicarboxylic acid, 3,4-pyridinedicarboxylic acid, 3,5-pyridinedicarboxylic acid, 1-(1',2'-dicarboxyethyl)benzotriazole, 4,4'-dicarboxy-2,2'-bipyridine and 5,5'-dicarboxy-2,2'-bipyridine.

[4]. The process for chemical mechanical polishing of a semiconductor substrate according to [3] above, wherein the surface to be polished has at least one selected from the group consisting of a copper layer and an insulating layer.

[5]. The process for chemical mechanical polishing of a semiconductor substrate according to [4] above, wherein the insulating layer has a modulus of 20 GPa or less measured by a nanoindentation method.

[6]. The process for chemical mechanical polishing of a semiconductor substrate according to [1] above, wherein the surface to be polished has at least one selected from the group consisting of a copper layer and an insulating layer.

[7]. The process for chemical mechanical polishing of a semiconductor substrate according to [6] above, wherein the insulating layer has a modulus of 20 GPa or less measured by a nanoindentation method.

[8]. An aqueous dispersion for chemical mechanical polishing comprising (A) an abrasive and (B) at least one compound selected from the group consisting of polycarboxylic acid having a heterocycle and anhydride thereof, wherein the dispersion is used for polishing a surface to be polished of the semiconductor substrate with a polishing pad, under conditions of a rotation speed of a polishing table fixing a polishing pad at the range from 50 to 200 rpm and a pressing pressure of the semiconductor substrate fixed to a polishing head against the polishing pad at the range from 700 to 18,000 Pa.

[9]. The aqueous dispersion for chemical mechanical polishing according to [8] above, wherein the abrasive (A) is comprised of at least one kind of particle selected from the group consisting of an inorganic particle and an organic particle, and an organic-inorganic composite particle.

[10]. The aqueous dispersion for chemical mechanical polishing according to [9] above, wherein the polycarboxylic acid having a heterocycle and anhydride thereof (B) is at least one compound selected from the group consisting of 2,3-pyridinedicarboxylic acid, 2,3-pyridinedicarboxylic anhydride, 2,5-pyridinedicarboxylic acid, 2.6-pyridinedicarboxylic acid, 3,4-pyridinedicarboxylic acid, 3,5-pyridinedicarboxylic acid, 1-(1',2'-dicarboxyethyl)benzotriazole, 4,4'-dicarboxy-2,2'-bipyridine and 5,5'-dicarboxy-2,2'-bipyridine.

According to the present invention, even in the case where a semiconductor substrate on which a material having a low mechanical strength such as an insulating layer having a low dielectric constant formed is polished, it is possible to considerably reduce occurrence of scratches on the surface to be polished and peeling at a periphery. In addition, it is possible to afford an excellent removal rate without affecting polishing of a metal layer as a wiring material, being very effective.

Further, according to the aqueous dispersion for chemical mechanical polishing, the abovementioned polishing process can be effectively realized.

DETAILED DESCRIPTION OF THE INVENTION

The invention is further detailed below.

In the process for chemical mechanical polishing of a semiconductor substrate of the present invention, an aqueous dispersion for chemical mechanical polishing (hereinafter, simply referred also to as "aqueous dispersion") containing (A) an abrasive (hereinafter, referred also to as "component (A)") and (B) at least one compound (hereinafter, referred also to "component (B)") selected from the group consisting of polycarboxylic acid having a heterocycle and anhydride thereof, is used.

Examples of the component (A) include an inorganic particle, an organic particle and an organic-inorganic composite particle.

Examples of the inorganic particle include silicon dioxide, aluminum oxide, cerium oxide, titanium oxide, zirconium oxide, silicon nitride and manganese dioxide. Among them, silicon dioxide is preferable. Examples of such the silicon dioxide include a silica synthesized by a fumed method for reacting silicon chloride with oxygen and hydrogen in a gas phase, a colloidal silica synthesized by a sol-gel method for hydrolyzing and condensing metal alkoxide, a colloidal silica synthesized by an inorganic colloid method for removing an impurities by purification, and the like.

As the organic particle, a particle composed of thermoplastic resin such as (i) polystyrene and styrene-based copolymer, (ii) (meth)acrylic resin including polymethyl methacrylate, (meth)acrylic-based copolymer, (iii) polyvinyl chloride, polyacetal, saturated polyester, polyamide, polyimide, polycarbonate and phenoxy resin, as well as (iv) polyolefin including polyethylene, polypropylene, poly-1-butene, poly-4-methyl-1-pentene and polyolefin-based copolymer, can be used. These can be prepared by an emulsion polymerizing method, a suspension polymerizing method, an emulsion dispersion method, a pulverizing method and the like. In addition, divinylbenzene, ethylene glycol dimethacrylate or the like may coexist at synthesis of the abovementioned polymer, and the resulting organic particle may be a copolymer having a cross-linked structure.

Among them, polystyrene, styrene-based copolymer, (meth)acrylic resin such as poly methyl methacrylate, (meth)acrylic-based copolymer and copolymers thereof which have a cross-linked structure, are preferable.

The organic-inorganic composite particle refers to a particle in which the inorganic particle and the organic particle exemplified above are integrally formed to such an extent that they are not easily separated during polishing, and a kind and a composition thereof are not particularly limited.

As a component constituting the composite particle, a particle obtained by polycondensating alkoxysilane, aluminum alkoxide, titanium alkoxide or the like in the presence of a particle of a polymer such as polystyrene, polymethyl methacrylate, to bind polysiloxane and the like to at least the surface of a polymer particle, can be used. The produced polycondensate may be directly bound to a functional group harbored by a polymer particle, or may be bound thereto via a silane coupling agent or the like.

In addition, a silica particle, an alumina particle or the like may be used in place of alkoxysilane or the like. These may be held entangled with polysiloxyane or the like, or may be chemically bound to a polymer particle through a functional group such as a hydroxyl group and the like harbored by them.

Further, the composite particle may be a particle in which an organic particle and an inorganic particle that have a different kind charge of zeta potential, respectively are bound through electrostatic force in an aqueous dispersion containing those two kinds of particles.

The zeta potential of the organic particle in that case is negative in a whole pH region, or over a wide region except for a low pH region in many cases, but an organic particle having a carboxyl group, a sulfonic acid group and the like makes zeta potential negative more assuredly. In addition, an organic particle having an amino group and the like makes zeta potential positive in a specific pH region. On the other hand, the zeta potential of the inorganic particle has a high pH dependency, and has an isoelectric point at which the potential becomes zero, around which a kind of charge for the zeta potential is reversed.

Therefore, by combining a specific organic particle and a specific inorganic particle and mixing them at a pH region around which a kind of charge for the zeta potential is reversed, the organic particle and the inorganic particle may be integrally converted into a composite through electrostatic force. In addition, even when the zeta potentials of them have the same charge at mixing, by changing pH to reverse a kind of charge for the zeta potential thereafter, the organic particle and the inorganic particle may be incorporated.

Further, as this organic-inorganic composite particle, a particle obtained by polycondensing alkoxysilane, aluminum alkoxide, titanium alkoxide or the like in the presence of a particle which has been integrally converted into a composite through electrostatic force like this, and further binding polysiloxiane or the like to at least the surface of this particle, may be used.

Then, a preferable particle diameter for the component (A) will be explained.

Regarding an inorganic particle, it is believed that a colloidal silica synthesized, for example, by a sol-gel method or a colloid method is present in the state where a primary particle is associated or aggregated (secondary particle) in an aqueous dispersion in the case of a relatively small particle diameter, in many cases.

A preferable average primary particle diameter is 1 to 3,000 nm, more preferable 2 to 1000 nm.

In addition, a preferable average secondary particle diameter is 5 to 5,000 nm, more preferably 5 to 3,000 nm, further preferably 10 to 1,000 nm. When the average secondary particle diameter is less than 5 nm, a removal rate becomes insufficient in some cases. On the other hand, exceeding 5,000 nm leads to an insufficient suppression of dishing and erosion in some cases, and a surface defect such as scratch is easily produced and, additionally, the stability of the aqueous dispersion for chemical mechanical polishing is reduced.

The average primary particle diameter can be measured from a specific surface area, with a transmission electron microscope and the like. In addition, the average secondary particle diameter can be measured with a laser scattering diffraction type measuring apparatus and the like.

On the other hand, a silica particle synthesized by a fumed method is originally prepared in the state of secondary particle form. Since it is very difficult to disperse the silica particle in an aqueous dispersion as a primary particle, it is believed that the particle is present in the state of a secondary particle in which primary particles are aggregated as described above. For this reason, it is enough to define only a secondary particle diameter regarding a silica particle and the like synthesized by a fumed method.

A preferable average secondary particle diameter of the silica particle synthesized by a fumed method is 10 to 10,000 nm, more preferably 20 to 7,000 nm, further preferably 50 to 5,000 nm. The use of the silica particle having an average secondary particle diameter in this range leads to an improved removal rate by an aqueous dispersion containing the silica particle, and dishing and erosion are sufficiently suppressed, and it is stable.

It is believed that most of organic particles are present as a sole particle in an aqueous dispersion.

A preferable average particle diameter of the organic particle is 10 to 5,000 nm, more preferably 15 to 3,000 nm, further preferably 20 to 1,000 nm. The use of the organic particle having an average particle diameter in this range leads an improved removal rate by an aqueous dispersion containing the organic particle, and dishing and erosion are sufficiently suppressed, and it is stable.

It is thought that the organic-inorganic composite particle is present in the state where 1 or 2 or more of the following (i), (ii) and (iii) are combined, depending on the chemical natures, a particle diameter and an amount of the organic particle and the inorganic particle to be used.

(i) The state where an organic particle is a core particle, and inorganic particles (in the state of a primary particle or a secondary particle) as a shell are attached around the organic particle, to form an organic-inorganic composite particle.

(ii) The state where an inorganic particle (in the state of a primary particle or a secondary particle) is a core particle, and organic particles as a shell are attached around the inorganic particle, to form an organic-inorganic composite particle.

(iii) The state where an organic particle and an inorganic particle (in the state of a primary particle or a secondary particle) are aggregated without taking a defined core/shell structure, to form an organic-inorganic composite particle.

Preferred is the state of (i) or (iii).

A ratio of an amount of an inorganic particle and that of an organic particle to be used in the above (i) to (iii) is preferably 1 to 2,000 parts by weight, further preferably 10 to 1,000 parts by weight of the inorganic particle based on 100 parts by weight of the organic particle.

In addition, a preferable average particle diameter of the organic-inorganic composite particle of the above (i) to (iii) is 20 to 20,000 nm, more preferably 50 to 10,000 nm, particularly preferable 50 to 5,000 nm.

An organic-inorganic composite particle in this range leads to an aqueous dispersion that a removal rate is improved, scratches are sufficiently suppressed, and it is stable.

Although an inorganic particle, an organic particle and an organic-inorganic composite particle as the component (A) can be used alone or in combination of 2 or more, a combination of the inorganic particle and the organic-inorganic composite particle, and a combination of the organic particle and the organic-inorganic composite particle are preferable. Thereby, an excellent removal rate is obtained, and scratches on a surface to be polished can be sufficiently suppressed. A particularly preferable embodiment is use of an inorganic particle and an organic-inorganic composite particle jointly.

When an inorganic particle and an organic-inorganic composite particle are used jointly, and when an organic particle and an organic-inorganic composite particle are used jointly, a ratio of the inorganic particle or the organic particle, and the organic-inorganic composite particle to be incorporated is preferably 1:10 to 10:1, further preferably 1:10 to 5:1, particularly preferably 1:5 to 5:1 by weight. By setting a ratio of both to be incorporated in such a range, the most superior effects can be manifested in respect of magnitude of a removal rate and suppression of scratches.

The content of the component (A) in an aqueous dispersion is preferably 0.01 to 15% by weight based on 100% by weight of a total of the aqueous dispersion. When the content of the component (A) is less than 0.01% by weight, an aqueous dispersion having a sufficient removal rate can not be obtained. On the other hand, when the component (A) is incorporated exceeding 15% by weight, the cost becomes higher and, at the same time, the stability of the aqueous dispersion becomes insufficient in some cases.

The component (B) is at least one compound selected from the group consisting of polycarboxylic acid having a heterocycle and anhydride thereof. A heterocycle group to be bound thereto is not particularly limited, but includes a pyridyl group, an indolyl group, a pyrrolinyl group, a triazolyl group, a triazinyl group and the like. In addition, polycarboxylic acid may be dicarboxylic acid, tricarboxylic acid, tetracarboxylic acid, or a compound having a number more than 4 of carboxyl groups.

In addition, the anhydride is not particularly limited as far as it is anhydride having a heterocycle, and it may be anhydride having a heterocycle and other carboxyl groups.

The component (B) may be only a polycarboxylic acid having a heterocycle, only an anhydride, or a combination of polycarboxylic acid having a heterocycle and an anhydride.

Examples of the component (B) include 2,3-pyridinedicarboxylic acid, 2,3-pyridinedicarboxylic anhydride, 2,5-pyridinedicarboxylic acid, 2,6-pyridinedicarboxylic acid, 3,4-pyridinedicarboxylic acid, 3,5-pyridinedicarboxylic acid, 1-(1',2'-dicarboxyethyl)benzotriazole, 4,4'-dicarboxy-2,2'-bipyridine, 5,5'-dicarboxy-2,2'-bipyridine and the like. These may be used alone or in a combination of 2 or more.

The carboxyl group bound to these compounds may be a structure of carboxylic acid (COOH), or a structure of carboxylate with alkali metal ion, alkaline earth metal ion, ammonium ion, amine compound ion or the like in an aqueous dispersion.

Preferred is 2,3-pyridinedicarboxylic acid, an alkali metal salt thereof and an ammonium salt thereof as the component (B).

The content of the component (B) is preferably 0.0001 to 7% by weight, more preferably 0.001 to 5% by weight, further preferably 0.01 to 1% by weight based on 100% by weight of a total of the aqueous dispersion. When the content of the component (B) is less than 0.0001% by weight, a removal rate becomes insufficient in some cases. On the other hand, when 7% by weight is incorporated, sufficient effects are obtained, and it is not necessary to incorporate exceeding this.

The aqueous dispersion used in the process for chemical mechanical polishing of a semiconductor substrate of the present invention contains the component (A) and the component (B) and, if necessary, may contain a protective layer-forming agent (passivation layer-forming agent), an oxidizing agent, an organic acid, a surfactant and the like.

The protective layer-forming agent adjusts a removal rate by reacting with a metal constituting a wiring material during polishing to form a protective layer on the surface of a layer comprised of this metal. Examples of the protective layer-forming agent include:

a heterocyclic compound which do not correspond to the component (B), such as benzotriazole, carboxybenzotriazole, tolyltriazole, thiourea, benzimidazole, benzofuroxane, 2,1,3-benzothiadiazole, 2-mercaptobenzothiazole, 2-mercaptobenzothiadiazole, 2-mercaptobenzooxazole, quinolinecarboxylic acid and melamine;

an amino acid such as glycine, alanine, valine, leucine, isoleucine, cystine, cysteic acid, aspartic acid, glutamic acid, aminobutyric acid;

an amino acid salt such as ammonium salt of the amino acid;

a compound such as salicylaldoxime, o-phenylenediamine, m-phenylenediamine, catechol and o-aminophenol; and the like. These may be used alone or in combination of 2 or more.

Among them, benzotriazole, carboxybenzotriazole, quinolinecarboxylic acid, glycine, alanine and salicylaldoxime are preferable, and benzotriazole, carboxybenzotriazole, quinolinecarboxylic acid and glycine are particularly preferable.

The content of the protective layer-forming agent is preferably 5% or less by weight, more preferably 0.001 to 3% by weight, further preferably 0.01 to 1% by weight based on 100% by weight of a total of the aqueous dispersion. The use of the protective layer-forming agent in this range leads to a suppressed dishing and erosion of a metal wiring while maintaining a sufficient removal rate.

The oxidizing agent and organic acid are added for the purpose of improving a removal rate.

Examples of the oxidizing agent include a persulfate, a hydrogen peroxide, an inorganic acid, an organic peroxide, a multivalent metal salt, a heteropolyacid and the like.

Examples of the persulfate include ammonium persulfate, potassium persulfate and the like.

Examples of the inorganic acid include nitric acid, hydrochloric acid, sulfuric acid and the like.

Examples of the organic peroxide include peracetic acid, perbenzoic acid, tert-butylhydroperoxide and the like.

Examples of the multivalent metal salt include permanganic acid compound, bichromic acid compounds and the like.

Examples of the permanganic acid compound include potassium permanganate and the like, and examples of the bichromic acid compound include potassium bichromate and the like.

Examples of the heteropolyacid include silicomolybdic acid, silicotungstic acid, phosphomolybdic acid, phosphotungstic acid, and silicotungstomolybdic acid and the like.

These oxidizing agents may be used alone or in combination of 2 or more. Among these oxidizing agents, from a viewpoint of that no metal element is contained and the degradation product is not harmful, hydrogen peroxide and organic peroxide are preferable, hydrogen peroxide is particularly preferable.

The content of the oxidizing agent is preferably 5% or less by weight, more preferably 0.01 to 3% by weight, further preferably 0.05 to 2% by weight based on 100% by weight of a total of the aqueous dispersion. When the content of the oxidizing agent is exceeding 5% by weight, a removal rate can be sufficiently improved, and it is not necessary to incorporate at a large amount exceeding 5% by weight.

A variety kinds of organic acid such as a monobasic acid, a dibasic acid, a hydroxyl acid and a carboxylate acid as the organic acid can be employed, and examples include a saturated acid, an unsaturated acid, an aromatic acid and the like.

Examples of the saturated acid include formic acid, acetic acid, butyric acid, oxalic acid, malonic acid, succinic acid, glutaric acid, adipic acid, hydroxyl acid and the like.

Examples of the unsaturated acid include maleic acid, fumaric acid and the like.

Examples of the aromatic acid include benzoic acid, phthalic acid.

Examples of the hydroxyl acid include lactic acid, malic acid, tartaric acid, citric acid and the like.

These may be used alone or in combination of 2 or more.

Among these organic acids, oxalic acid, malonic acid, maleic acid, lactic acid, tartaric acid and citric acid are preferable, and oxalic acid, malonic acid, maleic acid and lactic acid are particularly preferable.

The content of the organic acid is preferably 3% or less by weight, more preferably 0.01 to 2% by weight, further preferably 0.01 to 1% by weight based on 100% by weight of a total of the aqueous dispersion. When the content of the organic acid is 3% by weight, a removal rate is sufficiently improved, and it is not necessary to incorporate exceeding this.

The surfactant is added for the purpose of adjusting a removal rate and reducing scratches, and any of cationic surfactants, anionic surfactants, nonionic surfactants and the like can be used. Among them, anionic surfactants are particularly preferable.

Examples of the anionic surfactants include carboxylate, sulfonate, sulfate, phosphate and the like.

Examples of the carboxylate include fatty acid soap, alkylether carboxylate and the like.

Examples of the sulfonate include alkylbenzenesulfonate, alkylnaphthalenesulfonate, α-olefinsulfonate and the like.

Examples of the sulfate include higher alcohol sulfate, alkylether sulfate, polyoxyethylenealkylphenylether sulfate and the like.

Examples of the phosphate include alkylphosphate and the like.

Among these anionic surfactants, sulfonate is preferable, alkylbenzenesulfonate is further preferable, and potassium dodecylbenzenesulfonate and ammonium dodecylbenzenesulfonate are particularly preferable.

The content of the surfactant is preferably 2% or less by weight, more preferably 0.001 to 1% by weight, particularly preferably 0.001 to 0.5% by weight. The use of the surfactant in this range leads to an improved removal rate and occurrence of scratches is effectively suppressed.

The aqueous dispersion is the one that (A) an abrasive and (B) at least one compound selected from the group consisting of polycarboxylic acid having a heterocycle and anhydride thereof as well as other additives which are arbitrarily incorporated are dispersed or dissolved in an aqueous medium as described above. Examples of the aqueous medium include water, a mixed medium of water and alcohol, and the like. Examples of alcohol include methanol, ethanol and the like. As the aqueous medium, water is preferable.

The pH of the aqueous dispersion is preferably 3 to 12, more preferably 5 to 11, further preferably 7 to 10. The pH in this range leads to a sufficient removal rate, even when a fragile insulating layer is polished, occurrence of the surface defect such as scratch and the like can be suppressed.

The pH can be adjusted by appropriately adding the inorganic acid or the organic acid and a base.

Examples of the base include a hydroxide of an alkali metal, ammonia and the like. Examples of the hydroxide of an alkali metal include sodium hydroxide, potassium hydroxide, rubidium hydroxide, cesium hydroxide and the like.

In the process for chemical mechanical polishing of the present invention, polishing of a semiconductor substrate can be performed by using the above-mentioned aqueous dispersion, a commercially available chemical mechanical polishing apparatus such as "EPO112" and "EPO222" (trade name) manufactured by Ebara Corp., "LGP-510" and "LGP-552" (trade name) manufactured by Lapmaster SFT, "Mirra" (trade name) manufactured by Applied Material and the like, and a commercially available polishing pad such as "IC1000" and "IC1010" (trade name) manufactured by Rodel Nitta and the like.

In the process for chemical mechanical polishing of the present invention, the rotation speed of a polishing table to which a polishing pad is fixed is 50 to 200 rpm, preferably 70 to 180 rpm. In addition, a pressing pressure of a polishing head fixing a semiconductor substrate against the polishing pad is 700 to 18,000 Pa, preferably 1,400 to 15,000 Pa, more preferably 1,400 to 12,000 Pa.

In addition, in the process for chemical mechanical polishing of the present invention, an amount of an aqueous dispersion to be supplied onto a polishing pad is usually 10 to 500 mL/min, preferably 100 to 400 mL/min.

By adjusting the rotation speed of a polishing table, a pressing pressure and an amount of the chemical mechanical aqueous dispersion to be supplied in the above-mentioned range, both improved removal rate and better surface state of a surface to be polished can be satisfied. This effect is presumed to be due to setting of the frictional force between a polishing pad and a surface to be polished in an appropriate range.

As an index for the above-mentioned frictional force, it is effective to monitor a driving current of a polishing table during chemical mechanical polishing. An appropriate value of the driving current of the polishing table is different depending on a kind of a chemical mechanical polishing apparatus, a polishing pad and a surface to be polished which are used. For example, when "EPO112" (trade name) manufactured by Ebara Corp. as a chemical mechanical polishing apparatus, and "IC1000" (trade name) manufactured by Rodel Nitta as a polishing pad are used, an appropriate value is 7A or less, preferably 5A or less.

Examples of a material to be polished which can be chemical mechanical polished by the process for chemical mechanical polishing of the present invention include a semiconductor substrate obtained by forming a trench part on an insulating layer stacked on a substrate such as a silicon wafer and, depositing a metal as a wiring material on the whole surface of the substrate with a trench on which a barrier metal layer has been formed thereafter, and the like.

Examples of a metal constituting the wiring include copper, tungsten, aluminum and the like, and the present can be particularly suitably employed when the material is copper. Herein, copper includes, in addition to pure copper, an alloy of copper and silicon, an alloy of copper and aluminum, and an alloy containing copper at 95% by weight or more.

In addition, examples of a material constituting the barrier metal layer include tantalum, tantalum nitride, titanium, titanium nitride and the like. Herein, tantalum is not limited to pure tantalum but includes an alloy containing tantalum such as tantalum-niobium and the like. And tantalum nitride, titanium and titanium nitride are not limited to pure product.

The process for chemical mechanical polishing of the present invention can suppress a surface defect such as occurrence of scratches and the like even when an insulating layer having a low dielectric constant is used as a material to be polished. Since an insulating layer having a low dielectric constant is weaker in the mechanical strength as compared with the conventional $SiO_2$ layer, when chemical mechanical polishing is performed by the previously known process for chemical mechanical polishing, the surface defect such as scratch and the like easily occurs, but according to the process for chemical mechanical polishing of the present invention, the better surface state can be obtained even when such an insulating layer having a low dielectric constant is polished.

The process for chemical mechanical polishing of the present invention can be suitably applied even when an insulating layer having a low dielectric constant and having a modulus of 20 GPa or less as measured by a nanoindentation method as the material constituting an insulating layer is polished. The modules may be 10 GPa or less, particularly 5 GPa or less.

This modulus can be obtained by employing a nanoindenter "UMIS-2000" (trade name) manufactured by CSIRO described in the item of 4.1 nanoindenter of 4. principle and application of nanoindentation, in "Principle and Application of Nanoindentation Method", page 358–363, Non-Destructive Inspection, vol.47, No.6(1998), by the method described in the item of 4.2 a nanoindentation method using an acute angle indenter, or the method described in 4.3 a nanoindentation method using a hemispherical-shaped indenter.

Examples of the insulating layer having a low dielectric constant include:

an insulating layer comprised of silsesquioxane (dielectric constant; approximately 2.6 to 3.0), fluorine-containing $SiO_2$ (dielectric constant; approximately 3.3 to 3.5), polyimide-based resins (dielectric constant; approximately 2.4 to 3.6), benzocyclobutene (dielectric constant; approximately 2.7), organic SOG (dielectric constant; approximately 2.9) and the like, an insulating layer comprised of a polymer obtained by plasma polymerization of silane, alkoxysilane, alkylsilane, arylsilane, siloxane, alkylsiloxane or the like in the presence of oxygen, carbon monoxide, carbon dioxide, nitrogen, argon, water steam, ozone, ammonia or the like, and the like.

Among them, examples of the insulating layer comprised mainly of silsesquioxane include a porous layer having a density of 0.3 to 1.85 $g/cm^3$ and having fine air bubbles of a hole diameter of 100 nm or less.

By the process for chemical mechanical polishing of a surface of a semiconductor substrate obtained by forming a trench part on an insulating layer stacked on a silicon wafer and, depositing a metal as a wiring material on the whole surface of the wafer with a trench on which a barrier metal layer has been formed thereafter, a metal except for a metal (wiring material) embedded in the trench can be removed to form a recessed wiring.

Since the semiconductor substrate is that a barrier metal layer is formed between the metal layer as the wiring material and the insulating layer, the insulating layer part is ideally not chemical mechanical polished. However, in the actual chemical mechanical polishing process, since excess polishing (meaning that polishing is continued longer than a time calculated to be necessary for removing a metal layer) is performed for the purpose of removing a wiring material which remains at a slight amount on a part other than a trench, a material constituting the insulating layer is partially exposed on the surface to be polished in some cases and, in such case, a surface defect such as scratch is generated. The process for chemical mechanical polishing of the present invention has advantages that a surface defect such as scratch is suppressed and a yield of products is improved, even when a mechanical fragile material of a low dielectric constant is used as a material constituting an insulating layer.

When a surface of a semiconductor substrate obtained by forming a trench part on an insulating layer stacked on a silicon wafer and, depositing a metal as a wiring material on the whole surface of the wafer with a trench on which a barrier metal layer has been formed thereafter, is chemical mechanical polished, the process for chemical mechanical polishing of the invention leads to an effective suppression of a phenomenon that the insulating layer having a low dielectric constant as a lower layer peels from its periphery during polishing at a step where the insulating layer having a low dielectric constant is not exposed on the polishing surface, that is, at a step where only a metal layer as a wiring material is chemically mechanical polished. This effect is presumed to be due to setting of a frictional force between a polishing pad and a metal layer (preferably copper layer) as a material to be polished, in an appropriate range. As an index of this frictional force, a value of driving current of a polishing table upon chemical mechanical polishing can be used as a substitute as described above, and the driving current in this case should be understood as being a driving current at a step where a metal layer (preferably copper layer) is chemical mechanical polished.

DESCRIPTION OF THE PREFERRED EMBODIMENTS

Figure 1:
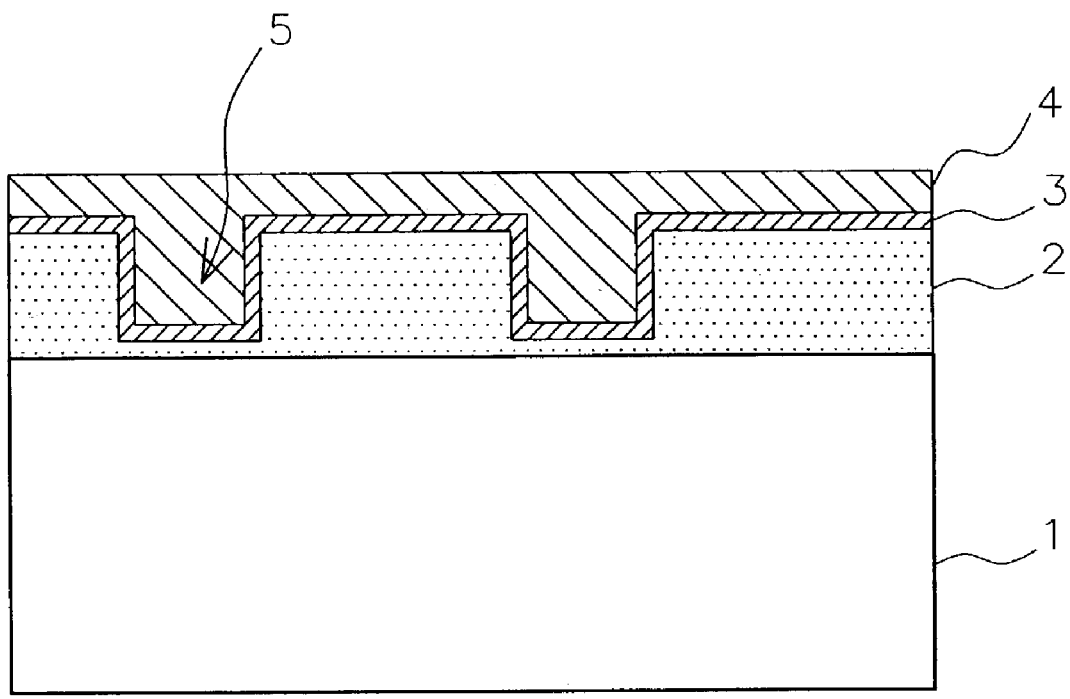
FIG. 1 is a cross-sectional view showing a wiring board before CMP.

The present invention is specifically explained below by way of Example.

1. Preparation of a Dispersion Containing an Abrasive 1-1. Preparation of a Dispersion Containing a Fumed Silica Particle 2 kg of a fumed silica particle (trade name; "Aerosil #50" manufactured by Nippon Aerosil Co., Ltd.) was placed in 6.7 kg of ion-exchanged water, dispersed therein with an ultrasonic disperser, filtered with a filter having a pore diameter of 5 μm to prepare a dispersion containing a fumed silica particle. An average primary particle diameter of the fumed silica particle contained in this dispersion was 20 nm, and an average secondary particle diameter was 200 nm.

1-2. Preparation of a Dispersion containing a Fumed Alumina Particle

A dispersion containing a fumed alumina particle was prepared similarly to above 1-1 except for exchanging the fumed silica particle for a fumed alumina particle (trade name; "Aluminum Oxide C" manufactured by Degussa Co., Ltd.). An average primary particle diameter of the fumed alumina particle contained in this dispersion was 13 nm, and an average secondary particle diameter was 130 nm.

1-3. Preparation of a Dispersion Containing an Abrasive Comprised of a Composite Particle 90 parts by weight of methyl methacrylate, 5 parts by weight of methoxy polyethylene glycol methacrylate (trade name; "NK Ester M-90G #400" manufactured by Shin-Nakamura Chemical Co., Ltd.), 5 parts by weight of 4-vinylpyridine, 2 parts by weight of an azo-based polymerization initiator (trade name; "V50" manufactured by Wako Pure Chemical Industries, Ltd.) and 400 parts by weight of ion-exchanged water were placed in a flask having a volume of 2 liter, a temperature of the mixture was raised to 70° C. while stirring in the nitrogen gas atmosphere, to perform polymerization for 6 hours. Thereby, a dispersion containing a polymethyl methacrylate-based particle which has a positive ion of an amino group and a polyethylene glycol chain and has an average particle diameter of 0.15 μm was obtained. Ion-exchanged water was added to this dispersion containing a polymethyl methacrylate-based particle, to adjust the content of the particle to 10% by weight. A polymerization yield was 95%.

Then, 100 parts by weight of this dispersion containing the polymethyl methacrylate-based particle (the particle content is 10% by weight) was placed in a flask having a volume of 2 liter, 1 part by weight of methyl trimethoxysilane was added, and the mixture was stirred at 40° C. for 2 hours. Thereafter, pH was adjusted to 2 with 1N nitric acid to obtain a dispersion (a).

The zeta potential of a polymethyl methacrylate-based particle containing in the dispersion (a) was +17 mV.

On the other hand, pH of a dispersion containing 10% by weight of a colloidal silica (trade name; "Snowtex O" manufactured by Nissan Chemical Co., Ltd.) (an average primary particle diameter of contained colloidal silica is 12 nm, and an average secondary particle diameter is 79 nm) was adjusted to 8 with 1N potassium hydroxide solution, to obtain a dispersion (b).

The zeta potential of a colloidal silica particle contained in the dispersion (b) was −40 mV.

Thereafter, 50 parts by weight of the dispersion (b) was slowly added to 100 parts by weight of the dispersion (a) over 2 hours to mix them, and the mixture was stirred for 2 hours to obtain a dispersion containing a particle in which the silica particle was attached to polymethyl methacrylate-based particle. At this step, pH of the mixed dispersion became 6.5, the zeta potential of the polymethyl methacrylate-based particle was +6.5 mV, and the zeta potential of the colloidal silica particle was −30 mV, at this pH.

Then, 2 parts by weight of vinyltriethoxysilane was added to the mixed dispersion, the mixtures was stirred for 1 hour, 1 part by weight of tetraethoxysilane was added, a temperature was raised to 60° C., and the mixture was continued to be stirred for 3 hours, and cooled to obtain a new dispersion containing a composite particle. An average particle diameter of the composite particle was 180 nm, and a silica particle was attached to 80% of the surface of a polymethyl methacrylate-based particle.

2. Preparation of an Aqueous Dispersion for Chemical Mechanical Polishing 2-1. Preparation of an Aqueous Dispersion [1]

A predetermined amount of the dispersion containing a fumed silica particle prepared in the above 1-1 was placed in a polyethylene bottle and, additives described in Table 1 were added according to the content (% by weight) described in Table 1, and then the mixture was sufficiently stirred. As a hydrogen peroxide, 31% by weight of aqueous hydrogen peroxide was employed, and an amount thereof was as described in Table 1 in terms of pure hydrogen peroxide. In Table 1, "DBK" denotes potassium dodecylbenzenesulfonate.

Then, pH was adjusted by addition of 10% by weight of aqueous potassium hydroxide solution, and ion-exchanged water was added to adjust a total amount of an aqueous dispersion to 100% by weight. After that, this mixture was filtered with a filter having a pore diameter of 5 μm to obtain an aqueous dispersion [1].

The pH of the chemical mechanical aqueous dispersion [1] was 10.5.

2-2. Preparation of Aqueous Dispersions [2] to [12]

Aqueous dispersions [2] to [12] were prepared similarly to the above aqueous dispersion [1] except using a kind and an amount of respective components to be incorporated, a pH adjusting agent and pH described in Table 1 to Table 3.

For the preparation of aqueous dispersions [3] to [10] and [12], a dispersion containing a fumed silica particle prepared in the above 1-1 and a dispersion containing a composite particle prepared in the above 1-3 are used. A predetermined amount of them were successively placed in a container to resulting dispersions. For the aqueous dispersion [6], quinaldinic acid and glycine were incorporated by successively adding them at each predetermined amount.

In addition, as ammonia which is a pH adjusting agent for the aqueous dispersions [7] and [8], 28% by weight of aqueous ammonia was employed at an amount described in Table 2 in terms of pure ammonia.

In Tables 2 and 3, "DBK" denotes potassium dodecylbenzenesulfonate.

TABLE 1

| Aqueous dispersion for chemical mechanical polishing | | [1] | [2] | [3] | [4] |
|---|---|---|---|---|---|
| Component (A) | | fumed silica | composite particle | fumed silica + composite particle | fumed silica + composite particle |
|  | (wt %) | 1 | 2 | 0.5 + 0.5 | 0.5 + 0.5 |
| Component (B) | | 2,3-pyridinedicarboxylic acid | 2,3-pyridinedicarboxylic acid | 2,3-pyridinedicarhoxylic acid | 2,3-pyridinedicarboxylic acid |
|  | (wt %) | 0.7 | 0.7 | 0.7 | 0.7 |
| Protective layer-forming agent | (wt %) | none | none | none | none |
| Oxidizing agent | | hydrogen peroxide | hydrogen peroxide | hydrogen peroxide | hydrogen peroxide |
|  | (wt %) | 1 | 1 | 1 | 1 |
| Organic acid | | oxalic acid | oxalic acid | oxalic acid | oxalic acid |
|  | (wt %) | 0.2 | 0.2 | 0.2 | 0.2 |
| Surfactant | | DBK* | DBK* | DBK* | DBK* |
|  | (wt %) | 0.05 | 0.05 | 0.05 | 0.05 |
| pH adjusting agent | | potassium hydroxide | potassium hydroxide | potassium hydroxide | potassium hydroxide |
| pH | | 10.5 | 7.5 | 9 | 10 |

*DBK denotes potassium dodecylbenzenesulfonate.

TABLE 2

| Aqueous dispersion for chemical mechanical polishing | | [5] | [6] | [7] | [8] |
|---|---|---|---|---|---|
| Component (A) | | fumed silica + composite particle | fumed silica + composite particle | fumed silica + composite particle | fumed silica + composite particle |
| | (wt %) | 0.5 + 0.5 | 0.5 + 0.5 | 0.5 + 0.5 | 0.5 + 0.5 |
| Component (B) | | 2,3-pyridinedicarboxylic acid | 2,3-pyridinedicarboxylic acid | 2,3-pyridinedicarboxylic acid | 2,3-pyridinedicarboxylic acid |
| | (wt %) | 0.7 | 0.4 | 0.7 | 0.7 |
| Protective layer-forming agent | | none | quinaldic acid + glycine | none | none |
| | (wt %) | — | 0.2 + 0.05 | — | — |
| Oxidizing agent | | hydrogen peroxide | hydrogen peroxide | hydrogen peroxide | hydrogen peroxide |
| | (wt %) | 1 | 0.5 | 1 | 1 |
| Organic acid | | oxalic acid | none | oxalic acid | oxalic acid |
| | (wt %) | 0.2 | — | 0.2 | 0.2 |
| Surfactant | | DBK* | DBK* | DBK* | DBK* |
| | (wt %) | 0.05 | 0.03 | 0.05 | 0.05 |
| pH adjusting agent | | potassium hydroxide | potassium hydroxide | potassium hydroxide | potassium hydroxide |
| pH | | 9.5 | 8.9 | 9 | 10 |

*DBK denotes potassium dodecylbenzenesulfonate.

TABLE 3

| Aqueous dispersion for chemical mechanical polishing | | [9] | [10] | [11] | [12] |
|---|---|---|---|---|---|
| Component (A) | | fumed silica + composite particle | fumed silica + composite particle | fumed alumina | fumed silica + composite particle |
| | (wt %) | 0.5 + 0.5 | 0.5 + 0.5 | 1 | 0.5 + 0.5 |
| Component (B) | | 3,4-pyridinedicarboxylic acid | 3,4-pyridinedicarboxylic acid | none | none |
| | (wt %) | 0.8 | 0.5 | — | — |
| Protective layer-forming agent | | glycine | quinaldic acid | benzotriazole | quinaldic acid |
| | (wt %) | 0.1 | 0.3 | 0.15 | 0.7 |
| Oxidizing agent | | hydrogen peroxide | hydrogen peroxide | hydrogen peroxide | hydrogen peroxide |
| | (wt %) | 0.5 | 1 | 1.3 | 1 |
| Organic acid | | none | malonic acid | ammonium citrate | oxalic acid |
| | (wt %) | — | 0.2 | 0.7 | 0.2 |
| Surfactant | | DBK* | DBK* | none | DBK* |
| | (wt %) | 0.03 | 0.05 | — | 0.05 |
| pH adjusting agent | | potassium hydroxide | potassium hydroxide | potassium hydroxide | potassium hydroxide |
| pH | | 4.8 | 8.9 | 9 | 9 |

*DBK denotes potassium dodecylbenzenesulfonate.

3. Examples 1 to 13 and Comparative Examples 1 to 6

Polishing performances of a copper film and an insulating layer were evaluated by using the aqueous dispersions [1] to [12] prepared as described above.

3-1. Evaluation of Polishing Performance of a Copper Film

An 8-inch thermal oxide film-coated silicon wafer on which copper film is formed (thickness of copper film; 15,000 Å, manufactured by Asahi Sangyo Co., Ltd.) was attached to a chemical mechanical polishing apparatus "EPO112" (trade name) manufactured by Ebara Corp. The surface of the copper film was polished with a polishing pad "IC1000" (trade name) manufactured by Rodel Nitta for 1 minute while supplying each of aqueous dispersion shown in Tables 1 to 3 at a rate of 300 ml/min under a pressing pressure and a rotation speed of a polishing table described in Tables 4 to 6. Maximal driving currents at the polishing table are shown in Tables 4 to 6.

In addition, a thickness of a copper film after polishing was measured with an electrical conducting type thickness measuring apparatus "Omnimap RS75" (trade name) manufactured by KLA Tencor Corp., and a removal rate of the copper film was calculated. The results are shown in Tables 4 to 6.

3-2. Assessment of the Polishing Performance of an Insulating Layer Having a Low Dielectric Constant 3-2-1. Preparation of an Insulating Layer Having a Low Dielectric Constant (i) Preparation of a Polysiloxane Sol A mixed solution containing 101.5 g of methyltrimethoxysilane, 276.8 g of methyl methoxypropionate and 9.7 g of tetraisopropoxy titanium/ethyl acetoacetate complex was heated to 60° C., and a mixture of 112.3 g of γ-butyrolactone and water (4.58:1 by weight ratio) was added dropwise to this mixed solution for 1 hour. After completion of addition of the mixture, the mixture was reacted at 60° C. for 1 hour to obtain a polysiloxane sol.

(ii) Preparation of a Polystyrene Particle 100 parts by weight of styrene, 2 parts by weight of azo-based polymerization initiator (trade name; "V60" manufactured by Wako Pure Chemical Industries, Ltd.), 0.5 part by weight of potassium dodecylbenzenesulfonate and 400 parts by weight of ion-exchanged water were placed in a flask, and a temperature was raised to 70° C. while stirring under the nitrogen gas atmosphere, to perform polymerization for 6 hours. Thereby, a polystyrene particle having an average particle diameter of 150 nm was obtained.

(iii) Preparation of an Insulating Layer Having a Low Dielectric Constant 15 g of the polysiloxane sol obtained in the above (i) and 1 g of the polystyrene particle obtained in the above (ii) were mixed, and the resulting mixture was coated on an 8-inch thermal oxide film-coated silicon wafer (manufactured by Asahi Sangyo Co., Ltd.) by a spin coating method, to obtain a coated layer having a thickness of 1.39 μm. Thereafter, the layer was heated at 80° C. for 5 minutes then at 200° C. for 5 minutes and, then, was heated at 340° C., 360° C. and 380° C. in this order for each 30 minutes under vacuum, and was further heated at 450° C. for 1 hour to form a colorless transparent cured film whose thickness is 2,000 Å.

A cross-section of the cured film was observed with a scanning electron microscope, and a formation of fine pores was observed. In addition, a specific dielectric constant was 1.98, a modulus was 3 GPa by a nanoindentation method, and a void rate was 15%.

3-2-2. Polishing of an Insulating Layer of a Low Dielectric Constant

Chemical mechanical polishing of the surface of the resultant insulating layer of a low dielectric constant was performed under the same conditions as those of above 3-1. A thickness of the insulating layer after polishing was measured with a light-interfering type thickness measuring apparatus "FPT500" (trade name) manufactured by SENTEC, and a removal rate was calculated. In addition, the presence or not of peeling at a periphery of the insulating layer was observed with a light microscope. And the number of scratches of the whole of the polished surface was counted with a wafer surface scanning apparatus "Surfscan SP1" manufactured by KLA Tencor Corp. The resulting value was converted into number per unit area ($10^{-1}mm^2$, a region of a 100×100 μm). When the reduced value is 5 or less, it can be said that scratch property is better.

The removal rate of the insulating layer having a low dielectric constant, the presence or not of peeling at a periphery and the number of scratches per unit area are shown in Tables 4 to 6.

TABLE 4

|  |  | Example | | | | | | |
|---|---|---|---|---|---|---|---|---|
|  |  | 1 | 2 | 3 | 4 | 5 | 6 | 7 |
| Aqueous dispersion for chemical mechanical polishing | | [1] | [2] | [3] | [4] | [5] | [3] | [3] |
| Rotation speed of polishing table (rpm) | | 100 | 100 | 100 | 80 | 60 | 50 | 50 |
| Pressure of polishing head (Pa) | | 9,800 | 9,800 | 9,800 | 9,800 | 9,800 | 9,800 | 11,800 |
| Polishing of copper film | Removal rate (Å/min) | 6,500 | 5,900 | 6,200 | 5,700 | 5,000 | 4,800 | 5,200 |
|  | Maximal driving current at polishing table (A) | 4.1 | 4.0 | 3.9 | 4.1 | 4.3 | 4.5 | 4.9 |
| Polishing of insulating layer | Removal rate (Å/min) | 50 | 32 | 38 | 28 | 25 | 21 | 24 |
|  | Peeling at periphery | none | none | none | none | none | none | none |
|  | Number of scratch ($/10^{-2}mm^2$) | 2 | 0 | 0 | 0 | 0 | 1 | 1 |

TABLE 5

|  |  | Example | | | | | |
|---|---|---|---|---|---|---|---|
|  |  | 8 | 9 | 10 | 11 | 12 | 13 |
| Aqueous dispersion for chemical mechanical polishing | | [5] | [6] | [7] | [8] | [9] | [10] |
| Rotation speed of polishing table (rpm) | | 100 | 100 | 100 | 100 | 100 | 100 |
| Pressure of polishing head (Pa) | | 17,000 | 9,800 | 9,800 | 9,800 | 9,800 | 9,800 |
| Polishing of copper film | Removal rate (Å/min) | 7,200 | 6,300 | 6,500 | 5,900 | 5,200 | 4,900 |
|  | Maximal driving current at polishing table (A) | 6.7 | 3.5 | 3.7 | 4.2 | 4.8 | 4.3 |
| Polishing of insulating layer | Removal rate (Å/min) | 31 | 28 | 30 | 21 | 33 | 23 |
|  | Peeling at periphery | none | none | none | none | none | none |
|  | Number of scratch ($/10^{-2}mm^2$) | 5 | 0 | 0 | 0 | 0 | 1 |

TABLE 6

|  |  | Comparative example | | | | | |
|---|---|---|---|---|---|---|---|
|  |  | 1 | 2 | 3 | 4 | 5 | 6 |
| Aqueous dispersion for chemical mechanical polishing | | [11] | [11] | [11] | [12] | [3] | [3] |
| Rotation speed of polishing table (rpm) | | 100 | 35 | 35 | 100 | 100 | 35 |
| Pressure of polishing head (Pa) | | 9,800 | 9,800 | 19,600 | 9,800 | 20,700 | 9,800 |
| Polishing of copper film | Removal rate (Å/min) | 6,900 | 4,500 | 5,200 | 6,700 | 7,300 | 2,400 |
|  | Maximal driving current at polishing table (A) | 9.1 | 4.1 | 8.7 | 8.5 | 9.3 | 4.7 |

TABLE 6-continued

|  |  | Comparative example | | | | | |
|---|---|---|---|---|---|---|---|
|  |  | 1 | 2 | 3 | 4 | 5 | 6 |
| Polishing of insulating layer | Removal rate (Å/min) | 75 | 43 | 52 | 34 | 65 | 20 |
|  | Peeling at periphery | marked | partly | marked | partly | partly | none |
|  | Number of scratch ($/10^{-2} mm^2$) | 20~ | 20~ | 20~ | 8 | 15 | 0 |

According to the results of Tables 4 and 5, it is seen that, a removal rate of the copper film is sufficiently high, and no or extremely little scratches occur even when a insulating layer having a fragile low dielectric constant is polished, in the process for chemical mechanical polishing of the present invention.

On the other hand, according to Table 6, it is seen that both a better surface state of the insulating layer and a sufficient removal rate of the copper film after polishing are not satisfied when chemical mechanical polishing is performed under conditions out of conditions defined in the present invention.

What is claimed is:

1. A process for chemical mechanical polishing of a semiconductor substrate characterized in that a surface to be polished of said semiconductor substrate is polished under conditions of a rotation speed of a polishing table fixing a polishing pad at the range from 50 to 200 rpm and a pressing pressure of said semiconductor substrate fixed to a polishing head against said polishing pad at the range from 700 to 18,000 Pa, by using an aqueous dispersion for chemical mechanical polishing comprising (A) an abrasive and (B) at least one compound selected from the group consisting of 2,3-pyridinedicarboxylic acid, 2,3-pyridinedicarboxylic anhydride, 2,5-pyridinedicarboxylic acid, 3,4-pyridinedicarboxylic acid, 3,5-pyridinedicarboxylic acid, 4,4'-dicarboxy-2,2'-bipyridine and 5,5'-dicarboxy-2,2'-bipyridine, and said polishing pad,
   wherein said surface to be polished has an insulting layer, wherein said insulting layer has a modulus of 20 GPa or less measured by a nanoindentation method,
   wherein said abrasive (A) is comprised of at least one kind of particle selected from the group consisting of an inorganic particle and an organic particle, and an organic-inorganic composite particle,
   wherein abrasive (A) is a organic-inorganic composite particle, and
   wherein the organic-inorganic composite particle is obtained by polycondensating alkoxysilane, aluminum alkoxide, or titanium alkoxide in the presence of a particle of polystyrene or polymethyl methacrylate.

2. The process for chemical mechanical polishing of a semiconductor substrate according to claim 1, wherein said surface to be polished has at least one selected from the group consisting of a copper layer and an insulating layer.

3. The process for chemical mechanical polishing of a semiconductor substrate according to claim 2, wherein said insulating layer has a modulus of 20 GPa or less measured by a nanoindentation method.

4. The process for chemical mechanical polishing of a semiconductor substrate according to claim 2, wherein said surface to be polished has a copper layer.

5. The process for chemical mechanical polishing of a semiconductor substrate according to claim 2, wherein said surface to be polished has an insulating layer, wherein said insulating layer has a modulus of 20 GPa or less measured by a nanoindentation method.

6. The process for chemical mechanical polishing of a semiconductor substrate according to claim 1, wherein said surface to be polished has at least one selected from the group consisting of a copper layer and an insulating layer.

7. The process for chemical mechanical polishing of a semiconductor substrate according to claim 6, where said insulating layer has a modulus of 20 GPa or less measured by a nanoindentation method.

8. The process for chemical mechanical polishing of a semiconductor substrate according to claim 1, wherein said surface to be polished has a copper layer.

9. The process for chemical mechanical polishing of a semiconductor substrate according to claim 1, wherein said surface to be polished has an insulating layer.

10. The process for chemical mechanical polishing of a semiconductor substrate according to claim 9, wherein said insulating layer has a modulus of 20 GPa or less measured by a nanoindentation method.

11. The process of claim 1, wherein the compound is 2,3-pyridinedicarboxylic acid.

12. The process of claim 1, wherein the compound is 2,3-pyridinedicarboxylic anhydride.

13. The process of claim 1, wherein the compound is 2,5-pyridinedicarboxylic acid.

14. The process of claim 1, wherein the compound is 3,4-pyridinedicarboxylic acid.

15. The process of claim 1, wherein the compound is 3,5-pyridinedicarboxylic acid.

16. The process of claim 1, wherein the compound is 4,4'-dicarboxy-2,2'-bipyridine.

17. The process of claim 1, wherein the compound is 5,5'-dicarboxy-2,2'-bipyridine.

18. A process for chemical mechanical polishing of a semiconductor substrate characterized in that a surface to be polished of said semiconductor substrate is polished under conditions of a rotation speed of a polishing table fixing a polishing pad at the range from 50 to 200 rpm and a pressing pressure of said semiconductor substrate fixed to a polishing head against said polishing pad at the range from 700 to 18,000 Pa, by using an aqueous dispersion for chemical mechanical polishing comprising (A) an abrasive and (B) at least one compound selected from the group consisting of 2,3-pyridinedicarboxylic acid, 2,3-pyridinedicarboxylic anhydride, 2,5-pyridinedicarboxylic acid, 3,4-pyridinedicarboxylic acid, 3,5-pyridinedicarboxylic acid, 4,4'-dicarboxy-2,2'-bipyridine and 5,5'-dicarboxy-2,2'-bipyridine, and said polishing pad,
   wherein said surface to be polished has an insulting layer, wherein said insulting layer has a modulus of 20 GPa or less measured by a nanoindentation method,
   wherein said abrasive (A) is comprised of at least one kind of particle selected from the group consisting of an inorganic particle and an organic particle, and an organic-inorganic composite particle, wherein abrasive (a) is a organic-inorganic composite particle, and
wherein the organic-inorganic composite particle is a silica particle attached to the surface of a polymethyl methacrylate-based particle.

19. The process for chemical mechanical polishing of a semiconductor substrate according to claim 18, wherein said surface to be polished has at least one selected from the group consisting of a copper layer and an insulating layer.

20. The process for chemical mechanical polishing of a semiconductor substrate according to claim 19, wherein said insulating layer has a modulus of 20 GPa or less measured by a nanoindentation method.

21. The process for chemical mechanical polishing of a semiconductor substrate according to claim 20, wherein said surface to be polished has a copper layer.

22. The process for chemical mechanical polishing of a semiconductor substrate according to claim 20, wherein said surface to be polished has an insulating layer, wherein said insulating layer has a modulus of 20 GPa or less measured by a nanoindentation method.

23. The process for chemical mechanical polishing of a semiconductor substrate according to claim 18, wherein said surface to be polished has at least one selected from the group consisting of a copper layer and an insulating layer.

24. The process for chemical mechanical polishing of a semiconductor substrate according to claim 23, where said insulating layer has a modulus of 20 GPa or less measured by a nanoindentation method.

25. The process for chemical mechanical polishing of a semiconductor substrate according to claim 18, wherein said surface to be polished has a copper layer.

26. The process for chemical mechanical polishing of a semiconductor substrate according to claim 18, wherein said surface to be polished has an insulating layer.

27. The process for chemical mechanical polishing of a semiconductor substrate according to claim 26, wherein said insulating layer has a modulus of 20 GPa or less measured by a nanoindentation method.

28. The process of claim 18, wherein the compound is 2,3-pyridinedicarboxylic acid.

29. The process of claim 18, wherein the compound is 2,3-pyridinedicarboxylic anhydride.

30. The process of claim 18, wherein the compound is 2,5-pyridinedicarboxylic acid.

31. The process of claim 18, wherein the compound is 3,4-pyridinedicarboxylic acid.

32. The process of claim 18, wherein the compound is 3,5-pyridinedicarboxylic acid.

33. The process of claim 18, wherein the compound is 4,4'-dicarboxy-2,2'-bipyridine.

34. The process of claim 18, wherein the compound is 5,5'-dicarboxy-2,2'-bipyridine.

35. A process for chemical mechanical polishing of a semiconductor substrate characterized in that a surface to be polished of said semiconductor substrate is polished under conditions of a rotation speed of a polishing table fixing a polishing pad at the range from 50 to 200 rpm and a pressing pressure of said semiconductor substrate fixed to a polishing head against said polishing pad at the range from 700 to 18,000 Pa, by using an aqueous dispersion for chemical mechanical polishing comprising (A) an abrasive and (B) at least one compound selected from the group consisting of 2,3-pyridinedicarboxylic acid, 2,3-pyridinedicarboxylic anhydride, 2,5-pyridinedicarboxylic acid, 3,4-pyridinedicarboxylic acid, 3,5-pyridinedicarboxylic acid, 4,4'-dicarboxy-2,2-bipyridine and 5,5'-dicarboxy-2,2'-bipyridine, and said polishing pad,
wherein said surface to be polished has an insulting layer,
wherein said insulting layer has a modulus of 20 GPa or less measured by a nanoindentation method,
wherein said abrasive (A) is comprised of at least one kind of particle selected from the group consisting of an inorganic particle and an organic particle, and an organic-inorganic composite particle,
wherein the organic-inorganic composite particle which has an organic particle and an inorganic-particle that have a different kind charge of zeta potential respectively, and
wherein the organic particle and the inorganic particle bound through electrostatic force in an aqueous dispersion.

36. The process for chemical mechanical polishing of a semiconductor substrate according to claim 35, wherein said surface to be polished has at least one selected from the group consisting of a copper layer and an insulating layer.

37. The process for chemical mechanical polishing of a semiconductor substrate according to claim 36, wherein said insulating layer has a modulus of 20 GPa or less measured by a nanoindentation method.

38. The process for chemical mechanical polishing of a semiconductor substrate according to claim 36, wherein said surface to be polished has a copper layer.

39. The process for chemical mechanical polishing of a semiconductor substrate according to claim 36, wherein said surface to be polished has an insulating layer, wherein said insulating layer has a modulus of 20 GPa or less measured by a nanoindentation method.

40. The process for chemical mechanical polishing of a semiconductor substrate according to claim 35, wherein said surface to be polished has at least one selected from the group consisting of a copper layer and an insulating layer.

41. The process for chemical mechanical polishing of a semiconductor substrate according to claim 40, where said insulating layer has a modulus of 20 GPa or less measured by a nanoindentation method.

42. The process for chemical mechanical polishing of a semiconductor substrate according to claim 35, wherein said surface to be polished has a copper layer.

43. The process for chemical mechanical polishing of a semiconductor substrate according to claim 35, wherein said surface to be polished has an insulating layer.

44. The process for chemical mechanical polishing of a semiconductor substrate according to claim 43, wherein said insulating layer has a modulus of 20 GPa or less measured by a nanoindentation method.

45. The process of claim 35, wherein the compound is 2,3-pyridinedicarboxylic acid.

46. The process of claim 35, wherein the compound is 2,3-pyridinedicarboxylic anhydride.

47. The process of claim 35, wherein the compound is 2,5-pyridinedicarboxylic acid.

48. The process of claim 35, wherein the compound is 3,4-pyridinedicarboxylic acid.

49. The process of claim 35, wherein the compound is 3,5-pyridinedicarboxylic acid.

50. The process of claim 35, wherein the compound is 4,4'-dicarboxy-2,2'-bipyridine.

51. The process of claim 35, wherein the compound is 5,5'-dicarboxy-2,2'-bipyridine.

* * * * *